| United States Patent [19] | [11] Patent Number: 5,072,035 |
|---|---|
| Chen et al. | [45] Date of Patent: Dec. 10, 1991 |

[54] METHOD FOR MAKING PIEZOELECTRIC CERAMIC FIBERS

[75] Inventors: Kuo-Chun Chen, Carlsbed; Haixing Zheng; John D. Mackenzie, both of Los Angeles, all of Calif.

[73] Assignee: The Regents of the University of California, Oakland, Calif.

[21] Appl. No.: 340,049

[22] Filed: Apr. 18, 1989

[51] Int. Cl.$^5$ ............................................. C04B 35/49
[52] U.S. Cl. .............................. 252/62.9; 264/177.11; 29/25.35
[58] Field of Search ................... 252/62.9; 264/176.1, 264/177.11; 428/241; 29/25.35

[56] References Cited

U.S. PATENT DOCUMENTS 4,921,328  5/1990  Seth ................................ 358/96.34

Primary Examiner—William R. Dixon, Jr.
Attorney, Agent, or Firm—Flehr, Hohbach, Test, Albritton & Herbert

[57] ABSTRACT

A method is provided for preparing piezoelectric fibers by concentrating a solution containing at least two metal alkoxides, a carboxylic acid and lead alkanoate to form a viscous liquid. The viscous liquid is drawn into amorphous fibers and the fibers are calcined and sintered to form the crystalline piezoelectric fibers.

5 Claims, No Drawings

METHOD FOR MAKING PIEZOELECTRIC CERAMIC FIBERS

This invention was made with Government support under Grant No. AFOSR-84-0022, awarded by the United States Air Force. The Government has certain rights in this invention.

The present invention is directed to a method for making piezoelectric (ferroelectric) ceramic fibers from metalloorganic precursors.

Polymer-piezoelectric ceramic composites have high electric sensitivity, and high mechanical strength as compared with polymers such as $PVF_2$. The polymer-piezoelectric ceramic composites, however possess better flexibility and better piezoelectric properties as compared with piezoelectric (non-polymer) ceramics. Thus the advantage of the polymer-piezoelectric ceramic composites is that they combine the large piezoelectric effects in poled piezoelectric (non-polymer) ceramics with the desired mechanical properties of the piezoelectric polymers (such as $PVF_2$). There is thus a continuing need for methods for preparing polymer-piezoelectric composites, particularly for the preparation of those composites in a manner which preserves the connectivity patterns of the diphase solid and the most sensitive responses to the mechanical stresses, while still generating electrical signals. Heretofore, some polymer-piezoelectric composites have been made by preparing piezoelectric particles in a polymer matrix. However in this particle-matrix configuration it is difficult to pole the discrete particles within the matrix to obtain anisotropic properties. Other methods have included the use of lead zirconate titanate rods in a matrix of epoxy or polyurethane aligned in an orderly fashion to obtain orientation-dependent properties.

The present invention provides a method of solving the orientation problem and the mechanical flexibility and stress problem, while preserving the desirable piezoelectric properties and providing the polymer-piezoelectric composite in a fiber form. An advantage of the fibers is that they can be oriented in various ways in the matrix in either one, two or three-dimensional manners, to preserve anisotropic properties. It is also advantageous in forming piezoelectric components from fibers rather than from ceramic rods or powders since fibers can be wound, weaved into various configurations. A primary use of the polymer-piezoelectric composites is in a mechanical-electrical transducer.

It is thus an object of the present invention to provide a novel and advantageous method for making ferroelectric fibers and forming polymer-piezoelectric composites.

It is also an object of the present invention to provide a novel organometallic precursor from which fibers can be drawn and processed into polymer-piezoelectric composites. These and other objects of the present invention will be provided by the following description and from practice of the invention.

SUMMARY OF THE INVENTION

The present invention provides a method for preparing piezoelectric (ferroelectric) fibers comprising the steps of forming a solution of metal alkoxides also containing an organic carboxylic acid and/or organic dicarboxylic acid, and a lead carboxylates; concentrating and polymerizing the solution into a viscous liquid to form organometallic precursors, drawing the viscous liquid into amorphous fibers, and heating the fibers to calcine and sinter them to a crystalline form.

DESCRIPTION OF THE PREFERRED EMBODIMENTS

A solution of the metal alkoxides of the metals which will ultimately form the piezoelectric (ferroelectric) fiber will first be formed. The metal alkoxides, often in liquid form, will therefore be selected from the group consisting of lead alkoxides, titanium alkoxides, zirconium alkoxides, niobium alkoxides, barium alkoxides, magnesium alkoxides and lanthanum alkoxides, potassium alkoxides or any other alkoxide of a metal which, in combination with other metals, can be formed into a homogeneous solution. Such other metals will include, but are not limited to, lead, lithium, sodium, strontium, calcium, vanadium, tantalum, and the like. The alkoxide groups which are components of the metal alkoxides are preferably alkoxides containing 2 to about 8 carbon atoms or may be aryl alkoxides, alkenyl alkoxides, or aralkyl alkoxides or aryl alkoxides or alkenyl alkoxides or aralkyl alkoxides up to about 20 carbon atoms. The nature of the alkyl, aryl, alkenyl or aralkyl group on the alkoxide is not particularly critical provided that the alkoxide is volatilized and/or decomposed at a temperature below about 900° C., which is a condition met by most organic alkoxides. The preferred alkoxide groups are those which are alkyl alkoxides containing from about 2 to about 6 carbon atoms, either linear or branched. The particularly preferred metal alkoxides which comprise the solution are titanium alkoxide (a tetraalkoxide), zirconium alkoxide (a tetraalkoxide), niobium alkoxide (a pentaalkoxide), barium alkoxide (a dialkoxide), magnesium alkoxide (a dialkoxide), lanthanum alkoxide (a trialkoxide).

The alkoxides are known compounds and may be formed, for example, by reacting a metal with a monohydric or polyhydric alcohol. Examples of metal alkoxides and their preparation are described, for example, in *Metal Alkoxides*, Bradley, D. C., et al., Academic Press (1978).

Another component of the metal alkoxide solution will be a monocarboxylic or dicarboxylic organic acid, preferably an organic acid containing 2 to about 8 carbon atoms such as acetic acid, malonic acid, octanoic acid, hexanoic acid, and the like. The amount of the organic acid is not particularly critical, but a preferred amount should be 0.3 to 0.7 times of the total moles of alkoxy groups of the metal alkoxides in the solution.

Another component of the metal alkoxide solution will be a lead carboxylate such as a lead acetate or other lead organic salt, for example, lead 2-ethylhexanoate. Again the nature of the carboxylate moiety is not particularly critical provided that the carboxy group will decompose below about 900° C., which is a condition met by most organic carboxylates. The amount of the lead carboxylate utilized in the solution should be approximately the stoichiometric amount of lead required to satisfy the empirical formula for the final piezoelectric (ferroelectric) fibers to be formed.

Since many of the metal alkoxides are liquids, the solution may therefore be formed without the use of a solvent. However, use of a solvent is not deemed to be detrimental to the invention provided that the solvent does not detrimentally react with any other components, i.e. the lead alkanoate, organic carboxylic acid, or metal alkoxide, to prevent formation of the desired polymer-piezoelectric composite. Therefore, such solvents such as alcohols, benzene, toluene, ketones, or xylene may be utilized, wherein they are volatilized and/or decomposed below about 200° C. and preferably below about 80° C. While not critical, it is preferred that the metal alkoxides first be mixed in approximate molar ratio of the metals to satisfy the final empirical formula of the desired piezoelectric fiber. The metal alkoxides will be mixed together to form a homogeneous solution and then preferably the organic acid will be added whereupon the solution will again be mixed. Finally, the lead carboxylate will be added, and the final solution will be refluxed to ensure homogeneous mixture of all the components. Preferably, once all of the components have been added to the solution, the solution will be mixed for a period of up to about 48 hours, preferably greater than 8 hours. A convenient period for mixing is about 18 to 24 hours, however it is realized that it will depend upon the mode of agitation and the amount of agitation utilized.

The solution will then be concentrated to a viscous liquid. Preferably the solution will be concentrated by heating under atmospheric pressure in air at a temperature less than about 100° C., preferably at about 80°-120° C., for a period of time sufficient to evaporate solvents, if present, or by evaporation under reduced pressure using a rotovapor. The solution will be concentrated until the viscosity of the fluid is such that it can be drawn or spun into fibers by conventional methods, such as that conventionally used in polymer fiber, or glass fiber technology. Thus, concentration by heating at about 80° C. for a period of 2-48 hours (depending on the amount of the solution) will usually suffice to form a sufficiently viscous fluid for drawing and spinning into fibers. Particularly if the solvent is used, the solution may also be concentrated under a reduced pressure (e.g. by a rotovapor) to enhance the rate of evaporation of the solvent.

The fibers as drawn from the viscous fluid will be amorphous in form. In order to attain their piezoelectric properties, they will be calcined and sintered by heating to a temperature in the range of about 200° and 900° C. for a period of time sufficient to calcine and sinter the fibers to crystalline form. In their crystalline form, the fibers will still remain sufficient flexible to be wound, woven or wrapped into desired forms.

While not intending to be limited by a particular theory it is believed that the concentrated solution comprises metal oxide precursors of the following formula after calcination: $Pb(Zr_xTi_{1-x})O_3$, $(Pb_{1-y}La_y)(Zr_xTi_{1-x})O_3$, $(Pb_xBa_{1-x})Nb_2O_6$, $K(Nb_xTa_{1-x})O_3$, $xPb(Mg_{1/3}Nb_{2/3})O_3\text{-}(1-x)Pb(Zr_yTi_{1-y})O_3$; $x \geq 0$, $y \leq 1$. The nature of organic species in the precursors will of course depend on the type of metal alkoxides and amounts of metal alkoxides utilized to form the solution. When calcined and sintered to their final crystalline fiber form, these fibers are in the following ceramic systems: $PbTiO_3\text{-}PbZrO_3$, $Pb(Mg_{1/3}Nb_{2/3})O_3\text{-}PbTiO_3\text{-}PbZrO_3$, $PbTiO_3\text{-}PbZrO_3\text{-}La_2O_3$, $PbNb_2O_6\text{-}BaNb_2O_6$, $KNbO_3\text{-}KTaO_3$. The calcinization and sintering can usually be conveniently accomplished at a temperature in the range of about 300° to 900° C. whereby any remaining organic alkoxides or compounds are decomposed and whereupon usually at about 500°-700° C., the crystalline piezoelectric fibers begin to form. The fibers according to the present invention are useful as functional ceramic materials for weaving into various connectivity patterns and then impregnated with polymers to become polymer-piezoelectric ceramic fiber composites. The polymer-piezoelectric fiber composites are useful as transducers, piezoelectric materials and dielectric materials and sensors.

The present invention is more particularly described and explained by means of the following example. It is understood that the present invention is not to be limited by the example and that various changes and modifications may be made without departing from the spirit and scope of the present invention.

EXAMPLE 1

Preparation of piezoelectric (ferroelectric) fiber with composition $Pb(Zr_{0.52}Ti_{0.48})O_3$ using titanium and zirconium alkoxides and lead carboxylate (1) Weigh 15.85 g (0.0375 mole) of zirconium normal propoxide liquid ($Zr(OC_3H_7)_4$; contains 21.6 w/o Zr metal). Add 10.0 g (0.0347 mole) titanium isopropoxide ($Ti(OC_3H_7)_4$) into the zirconium normal propoxide liquid. The measurement was performed inside a dry nitrogen atmosphere glove box. After the mixture was refluxed at 80° C. for 2 hours, 62.33 g (0.0722 mole) of lead 2-ethyl hexanoate liquid ($Pb(O_2C_8H_{15})_2$; contains 24.0 w/o Pb) was introduced. The solution was further refluxed for 8-24 hours. The solution was transferred to a petri dish and kept at 80° C. in an electric oven until it became a brownish yellow viscous resin-like mass. Fibers were drawn from this viscous mass. The viscosity of the mass can be adjusted, if needed, by adding either alcohols, toluene, benzene or xylene (10-50 weight percent of the weight of the viscous mass).

(2) The as-drawn fiber was amorphous by X-ray diffraction. The fibers were converted to polycrystalline ceramic piezoelectric fiber by slow heat treatment (0.5°-1° C./min heating rate) between 25° C.-200° C., then stepwise calcined at each 50° C. interval for 2-5 hours up to 600° C. Subsequently, the fibers were densified between 800°-900° C. for 5-24 hours.

EXAMPLE 2

Preparation of piezoelectric (ferroelectric) fiber with composition $Pb(Zr_{0.52}Ti_{0.48})O_3$ using titanium and zirconium aloxides and mixture of lead carboxylates Weigh 15.85 g (0.0375 mole) of zirconium normal propoxide liquid and 10.00 g of titanium isopropoxide into a 250 ml flask in a dry nitrogen atmosphere glove box. After the mixture has been refluxed at 80° C. for 2 hours, 31.17 g (0.0361 mole: half of the stoichiometric amount of the lead) of lead 2-ethyl hexanoate liquid was introduced. The solution was refluxed for 4 hours. Additional required lead was added as lead acetate (11.743 g; 0.0361 mole). The solution was concentrated as described in Example 1. Fibers were drawn from this solution. Heat treatment schedule is similar to those described in Example 1.

EXAMPLE 3

Preparation of piezoelectric (ferroelectric) fiber with composition $(Pb_{0.5}Ba_{0.5})Nb_2O_5$ using metal alkoxides, lead carboxylates and organic acid A 0.181 M stock solution of barium isopropoxide ($Ba(OC_3H_7)_2$) was prepared by reacting barium metal with dry isopropanol. In an oven-dried 500 ml round flask was placed 110 ml barium isopropoxide (0.02 mole) and 25.46 g (0.08 mole) of niobium ethoxide liquid ($Nb(OC_2H_5)_5$). The solution was heated at 70° C. for 1–4 hours and 31.72 g (0.22 mole) 2-ethylhexanoic acid was then added. The solution was refluxed for 1 hour and lead 2-ethylhexanoate (17.27 g, 0.02 mole) was slowly added with stirring (lead acetate can also be used). The solution was concentrated by evaporation in an oven kept at 80° C. Fiber can be drawn from concentrated viscous solution. Heat treatment schedule was similar to that described in Example 1.

What is claimed is:

1. A method for preparing polymer-piezoelectric fibers comprising the steps of:
    forming a solution comprising
    at least two metal alkoxides;
    an organic carboxylic acid, dicarboxylic acid or mixture thereof; and
    lead alkanoate;
    concentrating and polymerizing said solution at a temperature less than about 200° C. to form a viscous liquid;
    drawing said viscous liquid into amorphous fibers;
    heating said fibers at a temperature in the range of about 200° to 900° C. for a period of time sufficient to calcine and sinter to a crystalline form.

2. Crystalline polymeric piezoelectric fibers produced according to the process of claim 1.

3. Amorphous fibers produced according to a process comprising the steps of forming a solution comprising at least two metal oxides, an organic carboxylic acid, dicarboxylic acid or mixture thereof; and a lead alkanoate; concentrating and polymerizing said solution at a temperature less than about 100° C. to form a viscous liquid, and drawing said viscous liquid to form said amorphous fibers.

4. A process according to claim 1 wherein said metal oxides are selected from the group consisting of lead alkoxides, titanium alkoxides, zirconium alkoxides, niobium alkoxides, barium alkoxides, magnesium alkoxides, and lanthanum alkoxides.

5. A process according to claim 1 wherein said solution is concentrated at a temperature of about 80° C.–120° C.

* * * * *